United States Patent
Schubert et al.

(10) Patent No.: US 9,287,500 B2
(45) Date of Patent: Mar. 15, 2016

(54) MEMORY CELLS AND METHODS OF FORMING MEMORY CELLS

(71) Applicant: Micron Technology, Inc., Boise, ID (US)

(72) Inventors: Martin Schubert, Sunnyvale, CA (US); Scott E. Sills, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/844,429

(22) Filed: Sep. 3, 2015

(65) Prior Publication Data

US 2015/0380645 A1    Dec. 31, 2015

Related U.S. Application Data

(63) Continuation of application No. 14/070,374, filed on Nov. 1, 2013, now Pat. No. 9,153,776.

(51) Int. Cl.
*H01L 45/00* (2006.01)

(52) U.S. Cl.
CPC .......... *H01L 45/1266* (2013.01); *H01L 45/085* (2013.01); *H01L 45/146* (2013.01); *H01L 45/16* (2013.01)

(58) Field of Classification Search
CPC .............. H01L 45/1233; H01L 45/146; H01L 27/2409; H01L 45/08
USPC ........................................ 257/4, 295; 365/148
See application file for complete search history.

(56) References Cited

U.S. PATENT DOCUMENTS

| | | | |
|---|---|---|---|
| 8,409,915 B2 | 4/2013 | Smythe et al. | |
| 8,488,365 B2 | 7/2013 | Liu et al. | |
| 2003/0146427 A1* | 8/2003 | Campbell | H01L 45/085 257/2 |
| 2007/0008773 A1* | 1/2007 | Scheuerlein | H01L 45/1675 365/161 |
| 2013/0028003 A1* | 1/2013 | Wang | G11C 13/0007 365/148 |
| 2014/0264223 A1* | 9/2014 | Tendulkar | H01L 45/147 257/2 |

* cited by examiner

*Primary Examiner* — David Vu
*Assistant Examiner* — Jonathan Han
(74) *Attorney, Agent, or Firm* — Wells St. John P.S.

(57) ABSTRACT

Some embodiments include a memory cell having an electrode and a switching material over the electrode. The electrode is a first composition which includes a first metal and a second metal. The switching material is a second composition which includes the second metal. The second composition is directly against the first composition. Some embodiments include methods of forming memory cells.

15 Claims, 3 Drawing Sheets

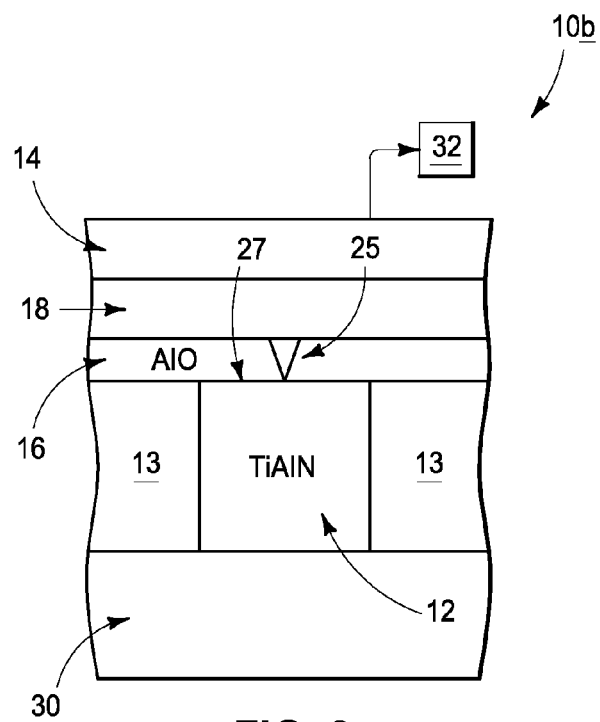
FIG. 3
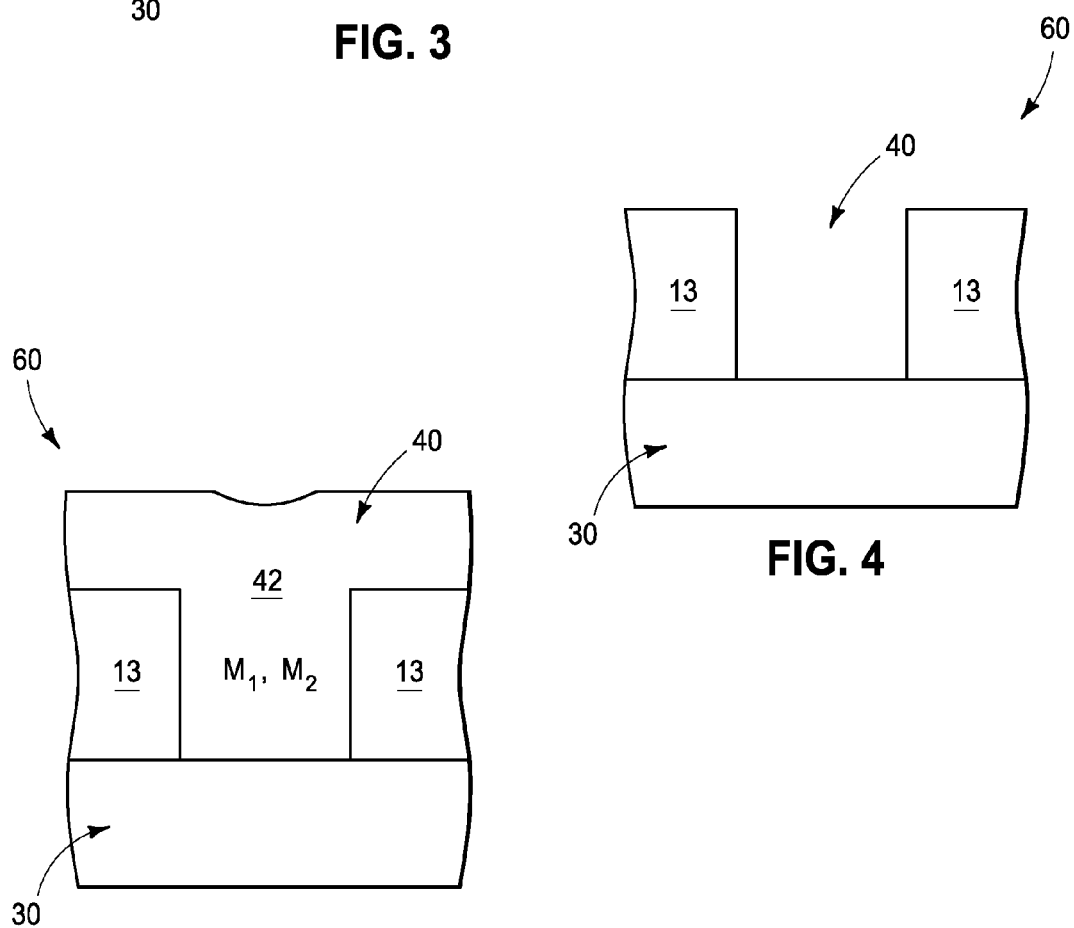
FIG. 4
FIG. 5

MEMORY CELLS AND METHODS OF FORMING MEMORY CELLS

RELATED PATENT DATA

This patent resulted from a continuation of U.S. patent application Ser. No. 14/070,374, which was filed Nov. 1, 2013, which issued as U.S. Pat. No. 9,153,776, and which is hereby incorporated herein by reference.

TECHNICAL FIELD

Memory cells and methods of forming memory cells.

BACKGROUND

Integrated memory may be used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory cell is a programmable metallization cell (PMC). Such may be alternatively referred to as conductive bridging random access memory (CBRAM), nanobridge memory, or electrolyte memory. A PMC may use ion conductive switching material (for instance, a suitable chalcogenide or any of various suitable oxides) and an ion reservoir material adjacent the switching material. The ion reservoir material and switching material may be provided between a pair of electrodes. A suitable voltage applied across the electrodes can cause ions to migrate from the ion reservoir material into the switching material to thereby create one or more current-conductive paths through the switching material. An opposite voltage applied across the electrodes essentially reverses the process and thus removes the current-conductive paths. A PMC thus comprises a high resistance state (corresponding to the state lacking a conductive bridge extending through a switching material) and a low resistance state (corresponding to the state having a conductive bridge extending through a switching material), with such states being reversibly interchangeable with one another.

Although there has been effort toward development of PMCs and other memory cells, there remains a need for improved memory cells.

BRIEF DESCRIPTION OF THE DRAWINGS

FIG. 3 shows another example embodiment memory cell in cross-sectional side view.

FIGS. 4-7 show a semiconductor construction in cross-sectional side view, and illustrate process stages of an example embodiment process for forming an example embodiment memory cell.

DETAILED DESCRIPTION OF THE ILLUSTRATED EMBODIMENTS

A performance aspect of PMCs can be conductivity through the electrodes, with higher conductivity electrodes being desired. Another performance aspect can be stability of a conductive bridge; and, in particular, stability of electrical coupling across an interface between a conductive bridge and an adjacent electrode. Some embodiments provided herein utilize a common element within a switching material and an adjacent electrode to enable characteristics of a memory cell to be tailored to achieve a desired balance between conductive bridge stability and electrode conductivity. The common element within the switching material and the adjacent electrode may improve reliability of the memory cell as compared to conventional memory cells, and may improve durability of the memory cell as compared to conventional memory cells. Example embodiments are described with reference to FIGS. 1-7.

Figure 1:
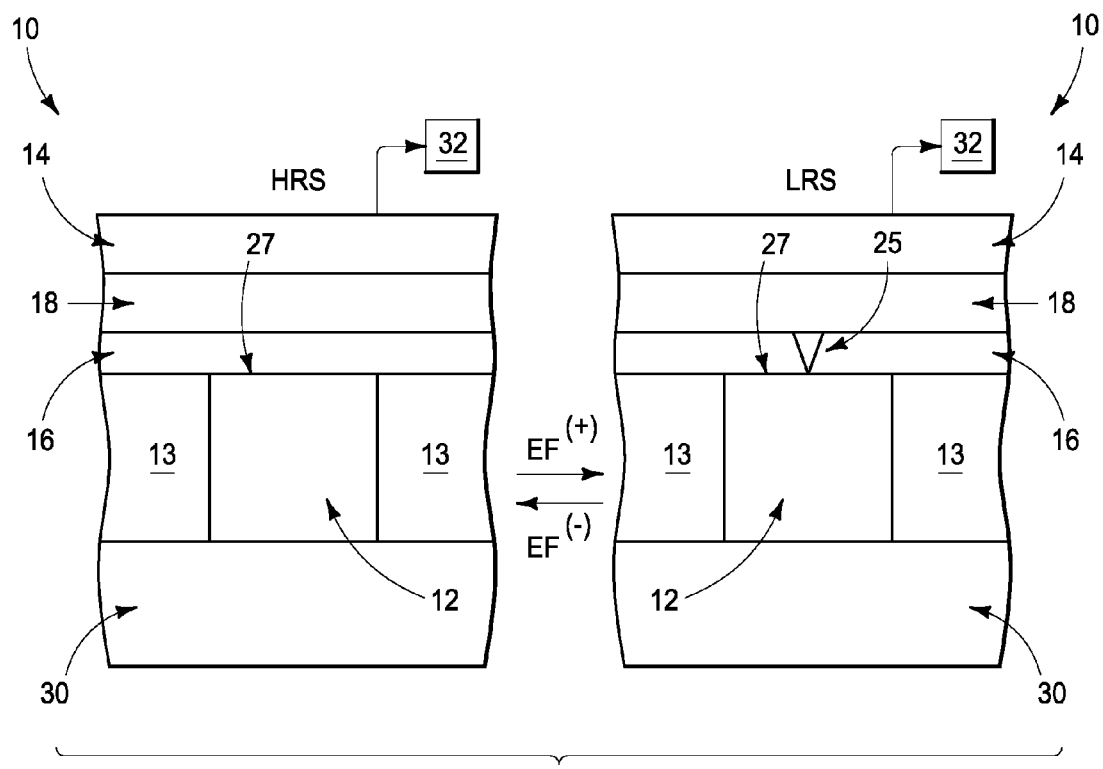
FIG. 1 shows an example embodiment PMC in cross-sectional side view reversibly transitioning between a low resistance state (LRS) and a high resistance state (HRS).

Referring to FIG. 1, a PMC (i.e., memory cell) 10 is illustrated in two modes corresponding to a high resistance state (HRS) and a low resistance state (LRS). The two modes are reversibly interchanged with one another through application of electric fields $EF^+$ and $EF^-$, with $EF^+$ being of opposite polarity relative to $EF^-$.

The PMC comprises a pair of electrodes 12 and 14, which may be referred to as a first electrode and a second electrode, respectively. The PMC also comprises a switching material 16 and an ion reservoir material 18 between the electrodes.

Electrodes 12 and 14 may comprise any suitable electrically conductive composition or combination of compositions; and may be the same composition as one another or may be different compositions relative to one another. In some embodiments, the electrodes may comprise, consist essentially of, or consist of one or more of various metals (for example, tungsten, titanium, etc.) or metal-containing compositions (for instance, metal nitride, metal carbide, metal silicide, etc.). For instance, in some embodiments the electrode 12 may comprise, consist essentially of, or consist of a titanium-containing composition (for instance, titanium aluminum nitride); and the electrode 14 may comprise, consist essentially of, or consist of tungsten.

In the shown embodiment, the electrode 12 extends through a dielectric material 13. In some embodiments, such dielectric material may comprise, consist essentially of, or consist of silicon nitride.

The memory cell 10 is shown to have the bottom electrode 12 connected to a conductive line 30, and to have the top electrode 14 connected to a conductive line 32 (diagrammatically illustrated with a box). The lines 30 and 32 may be sense and/or access lines coupled to the electrodes, and configured for providing appropriate electric fields across the memory cell during read/write operations. In some embodiments, the illustrated memory cell may be one of a plurality of memory cells of a memory array, and the lines 30 and 32 may be part of a circuit configuration utilized to uniquely address each of the memory cells of the array. In some embodiments, a "select device" (not shown) may be provided adjacent the memory cell 10 to reduce undesired current leakage to and/or from the memory cell during utilization of the memory cell in a memory array. Example select devices include diodes, transistors, ovonic threshold switches, etc. The select device may be provided between electrode 12 and line 30 in some embodiments.

The line 30 may be supported by a semiconductor substrate (not shown). Such substrate may comprise, for example, monocrystalline silicon and/or other suitable semiconductor materials, and may be part of a semiconductor die. Accordingly the memory cell 10 may be part of an integrated circuit supported by a semiconductor chip.

The switching region 16 may be a solid, gel, or any other suitable phase, and may comprise chalcogenide-type materials (for instance, materials comprising one or more of tellurium, sulfur and selenium), oxides (for instance, aluminum oxide, zirconium oxide, hafnium oxide, tungsten oxide, silicon oxide, etc.) and/or any other suitable materials.

The ion reservoir material 18 contributes ions which ultimately form one or more conductive bridges 25 across the switching material 16. The ion reservoir material may comprise any suitable composition or combination of compositions. In some embodiments, the ion reservoir material may comprise one or more of aluminum, copper, silver and chalcogen (for instance, tellurium); and may be configured for contributing aluminum cations, copper cations and/or silver cations for formation of one or more conductive bridges. The conductive bridges may have any suitable configuration and may be filaments of conductive particles (for instance ions or ion clusters) in some embodiments.

In the shown embodiment, the conductive bridge 25 is diagrammatically illustrated as being entirely absent in the high resistance state (HRS) configuration of the memory cell. In other embodiments, a portion of the conductive bridge may remain in the HRS configuration of the memory cell.

Although the ion reservoir material is shown comprising a single composition, in other embodiments the ion reservoir material may comprise two or more different compositions. Similarly, although the switching material is shown comprising only a single composition, in other embodiments the switching material may comprise two or more different compositions.

Figure 2:
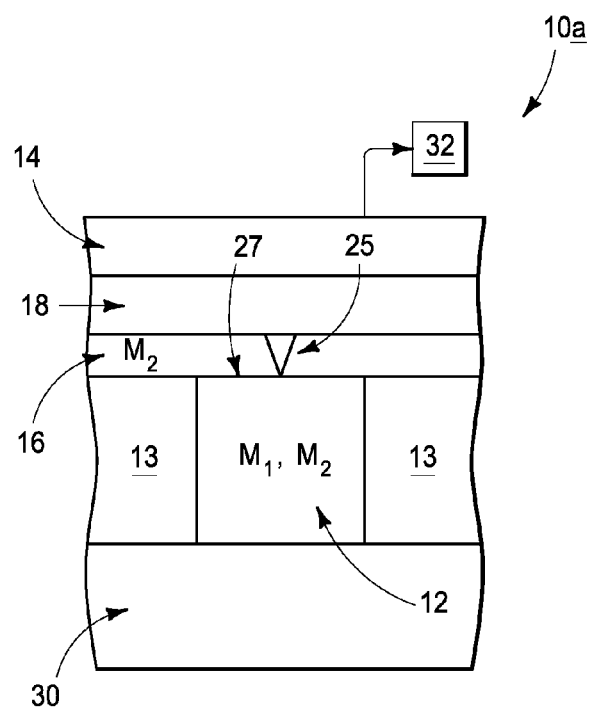
FIG. 2 shows an example embodiment memory cell in cross-sectional side view.

The switching material 16 is directly against the electrode 12 along an interface 27. The conductive bridge 25 electrically couples to the electrode at such interface. In some embodiments, the electrode 12 along one side of the interface 27 shares a common metal with the switching material 16 along the opposing side of the interface. FIG. 2 diagrammatically illustrates an example memory cell 10a having the switching material 16 and the electrode 12 sharing a common metal, $M_2$, on opposing sides of the interface 27. Specifically, the electrode 12 comprises a composition containing a first metal, $M_1$, and the shared second metal $M_2$, and the switching material 16 comprises a composition containing the second metal $M_2$. In some embodiments, the first metal may be titanium, and the second metal may be selected from the group consisting of W, Ta, Hf, Zr, Al and mixtures thereof.

The first composition utilized in the electrode 12 may comprise only the metals, or may comprise compounds including metals (for instance, nitrides, carbides, silicides, etc.). The second composition utilized in the switching material 16 may be a dielectric corresponding to a metal oxide, metal sulfide, etc. Although the electrode 12 is shown comprising a pair of metals, in other embodiments the electrode may comprise more than two metals. Regardless, the electrode may comprise at least one metal which is in common with the switching material 16, and at least one metal which is not in common with the switching material.

The memory cell 10a is shown in a low resistance state, and accordingly a conductive bridge 25 extends across switching material 16 and electrically couples with an upper surface of electrode 12.

The composition of electrode 12 may be any suitable composition, and in some embodiments may correspond to the nitride $M_1M_2N$, where $M_1$ and $M_2$ are the first and second metals, respectively; and where the formula lists primary elements rather than designates a specific stoichiometry.

The composition of switching material 16 may be any suitable composition, and in some embodiments may correspond to the oxide $M_2O$, where $M_2$ is the second metal, and where the formula lists primary elements rather than designates a specific stoichiometry.

In some embodiments, the region of electrode 12 along interface 27 may correspond to $M_1M_2N$, where $M_1$ and $M_2$ are the first and second metals, respectively; and where the formula lists primary elements rather than designates a specific stoichiometry; and the region of switching material 16 along the interface 27 (and thus directly against the electrode 12) may correspond to the oxide $M_2O$, where $M_2$ is the second metal, and where the formula lists primary elements rather than designates a specific stoichiometry. In such embodiments, $M_1$ may be titanium; and $M_2$ may be one or more of Al, W, Ta, Hf and Zr.

FIG. 3 illustrates a memory cell 10b showing a specific embodiment in which the nitride of electrode 12 comprises, consists essentially of, or consists of TiAlN, where the formula lists primary elements rather than designates a specific stoichiometry; and in which the switching material 16 comprises, consists essentially of, or consists of AlO, where the formula lists primary elements rather than designates a specific stoichiometry. In such embodiments, the aluminum within the electrode undesirably reduces conductivity, and yet such aluminum also improves stability of conductive bridge 25 (due to having the common aluminum component on both sides of interface 27). It is desired to tailor the memory cell to achieve suitable conductivity across electrode, and suitable stability of the conductive bridge. It is found that a desired balance may be achieved in some applications by having an atomic ratio of Ti:Al of the TiAlN within a range of from about 5:1 to about 2:1. In some embodiments, it is found that a desired balance may be achieved utilizing TiAlN having a stoichiometry of $Ti_{(1-x)}Al_{(x)}N$, with x being within a range of from about 0.15 to about 0.35.

The memory cells described above may be formed utilizing any suitable processing. An example method of forming memory cell 10a is described with reference to FIGS. 4-7.

Referring to FIG. 4, a construction 60 is shown at a processing stage in which an opening 40 has been formed to extend through dielectric material 13 to an upper surface of the conductive line 30. The opening 40 may be formed with any suitable processing. For instance, a mask (not shown) may be formed over material 13 to define a location of opening 40, the opening may be transferred through opening 13 with one or more suitable etches, and then the mask may be removed to leave the shown construction of FIG. 4. The mask may comprise any suitable mask, including, for example, a photolithographically-patterned photoresist mask and/or a mask formed utilizing pitch multiplication methodologies.

Referring to FIG. 5, material 42 is formed within opening 40. The material 42 comprises the metals $M_1$ and $M_2$ discussed above with reference to FIG. 2.

Figure 6:
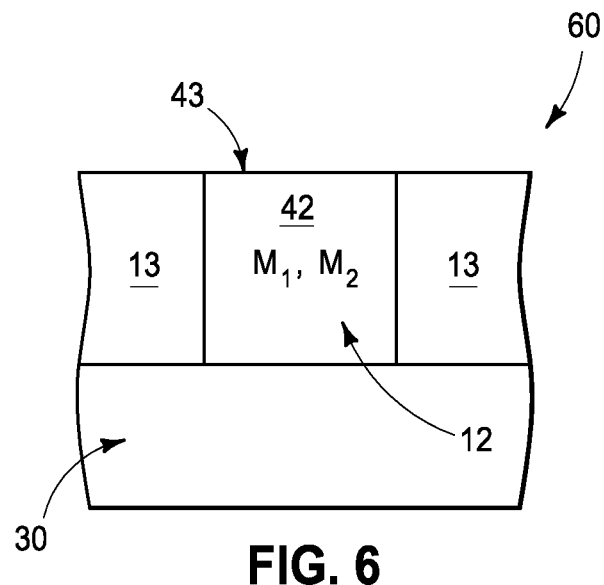

Referring to FIG. 6, material 42 is subjected to planarization (for instance, chemical-mechanical polishing) to form a planarized surface 43 extending across materials 13 and 42. Such patterns material 42 into the electrode 12.

Figure 7:
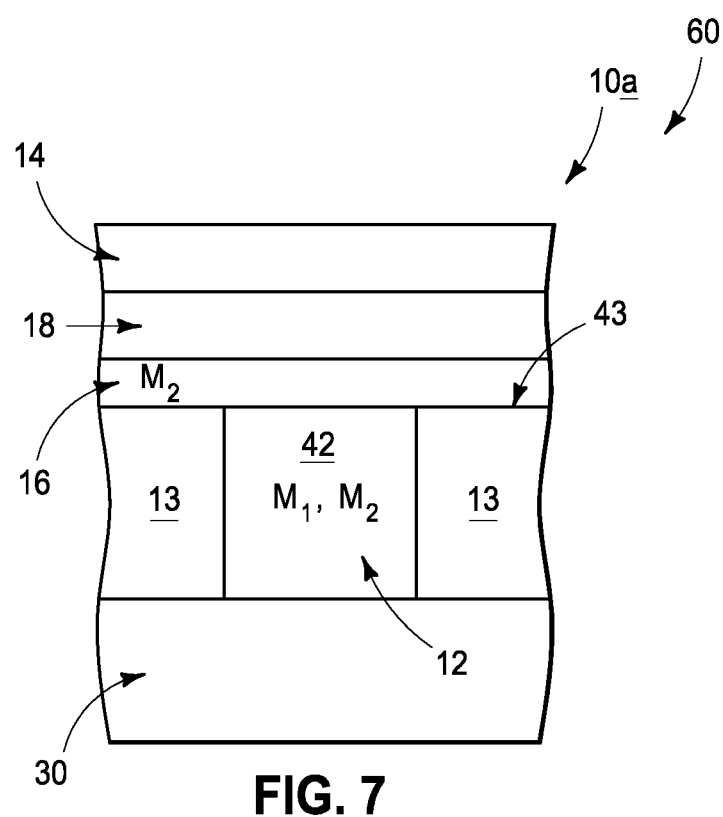

Referring to FIG. 7, the switching material 16 is formed over and directly against planarized surface 43, the ion reservoir material 18 is formed over the switching material 16, and the top electrode 14 is formed over the ion reservoir material 18. Accordingly, the memory cell 10a is formed (the memory cell is shown in the high resistance state in FIG. 7, and thus there is no conductive bridge extending through the switching material). The switching material 16 is shown to comprise the metal $M_2$ discussed above with reference to FIG. 2.

The first and second metals $M_1$ and $M_2$ of FIG. 7 may correspond to any of the metals described above with reference to FIGS. 2 and 3. Accordingly, in some embodiments material 42 may correspond to a nitride comprising titanium and one or more of tungsten, tantalum, hafnium, zirconium and aluminum; and the switching material 16 may comprise an oxide containing a metal in common with the material 42. In some embodiments, the common metal may be one or more of tungsten, tantalum, hafnium, zirconium and aluminum. In some example embodiments, the material 42 may comprise titanium aluminum nitride, and the switching material 16 may comprise aluminum oxide.

Although the invention is described relative to PMC-based RRAM, in other embodiments various aspects may be applied to other types of memory. For instance, in some embodiments a common element within a switching material and an adjacent electrode may be utilized in other types of RRAM besides PMC-based RRAM. In such embodiments, the switching material may comprise other compositions besides those described above, and the ion reservoir material of the shown embodiments may be omitted, or replaced with other materials. In an example embodiment, the RRAM may be an oxygen-vacancy-based RRAM; and the switching material may contain oxygen ions distributed within a composition that comprises oxygen in combination with one or more transition metal oxides and transition metal silicates (e.g., HfO, HfSiO, TaO, TiO, ZrO; where such compositions are shown in terms of the elements contained therein rather than in terms of a specific stoichiometry). In another example embodiment, the RRAM may be a mixed-valence-oxide-based RRAM; and the switching material may contain praseodymium, barium, calcium, manganese, strontium, titanium, iron, cesium and lead. For instance, the composition may comprise one or more of PrCaMnO, BaSrTiO, SrTiO, SrCeFeO, and PbO, where such compositions are shown in terms of the elements contained therein, rather than in terms of a specific stoichiometry. In some embodiments, the composition shown as PrCaMnO may correspond to $Pr_{(1-x)}Ca_xMnO_3$, where x is any number greater than 0 and less than 1. The switching material may be part of programmable arrangement that comprises two or more materials (for instance, that comprises high-k oxide against multivalent metal oxide). Example oxygen-vacancy-based systems (or, more generally, systems utilizing oxygen species transport) are described in, for example, U.S. Pat. Nos. 8,488,365 and 8,409,915.

The memory cells discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include memory cells that comprise an electrode and a switching material over the electrode. The electrode comprises a first composition which includes a first metal and a second metal, and the switching material comprises a second composition which includes the second metal. The second composition is directly against the first composition.

Some embodiments include memory cells that comprise an electrode, a switching material over the electrode and directly against the electrode along an interface, and an ion reservoir material over the switching material. The switching material comprises an oxide at the interface. The electrode comprises a nitride at the interface. The nitride includes at least two different metals, with at least one of said at least two different metals not being present in the oxide, and with at least one of said at least two different metals being present in the oxide.

Some embodiments include methods of forming memory cells. A first electrode is formed to comprise a first composition containing a first metal and a second metal. A switching material is formed over the first electrode and directly against the first composition at an interface. The switching material comprises a second composition at the interface, with the second composition containing the second metal. An ion reservoir material is formed over the switching material. A second electrode is formed over the ion reservoir material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
an electrode;
a switching material proximate the electrode;

an ion reservoir material proximate the switching material and on an opposing side of the switching material from the electrode;

wherein the electrode comprises a first composition which includes a first metal and a second metal, and the switching material comprises a second composition which includes the second metal; the second composition being directly against the first composition; and wherein:

the first composition is TiAlN, where the formula lists primary elements rather than designates a specific stoichiometry; and the second composition is AlO, where the formula lists primary elements rather than designates a specific stoichiometry.

2. The memory cell of claim 1 where an atomic ratio of Ti:Al within the first composition is within a range of from about 5:1 to about 2:1.

3. The memory cell of claim 1 where the TiAlN has a stoichiometry of $Ti_{(1-x)}Al_{(x)}N$, with x being within a range of from about 0.15 to about 0.35.

4. A memory cell, comprising:

an electrode;

a switching material proximate the electrode;

an ion reservoir material proximate the switching material and on an opposing side of the switching material from the electrode;

wherein the electrode comprises a first composition which includes a first metal and a second metal, and the switching material comprises a second composition which includes the second metal; the second composition being directly against the first composition; and wherein:

the first composition comprises $M_1M_2N$, where $M_1$ and $M_2$ are metals and the formula lists primary elements rather than designates a specific stoichiometry; and the second composition comprises $M_2O$, where $M_2$ is the metal and the formula lists primary elements rather than designates a specific stoichiometry.

5. The memory cell of claim 4 where $M_1$ is Ti; and where $M_2$ is one or more of W, Ta, Hf, Zr and Al.

6. A memory cell, comprising:

a switching material against an electrode along an interface;

an ion reservoir material on an opposing side of the switching material from the electrode, wherein the ion reservoir material comprises one or more of aluminum, copper and silver;

wherein the switching material comprises an oxide at the interface;

wherein the electrode comprises a nitride at the interface; and wherein the nitride includes at least two different metals, with at least one of said at least two different metals not being present in the oxide, and with at least one of said at least two different metals being present in the oxide.

7. The memory cell of claim 6 wherein the nitride and oxide both comprise one or more of Al, Hf, Zr, Ta and W.

8. The memory cell of claim 6 wherein the nitride and oxide both comprise Al.

9. The memory cell of claim 6 wherein the nitride and oxide both comprise one or both of Hf and Zr.

10. The memory cell of claim 6 wherein the nitride and oxide both comprise one or both of Ta and W.

11. A method of forming a memory cell, comprising:

forming an opening to extend through a dielectric material to a conductive line;

forming a first electrode within the opening and adjacent the conductive line; the first electrode comprising a first composition containing a first metal and a second metal;

forming a switching material over the first electrode and along the first composition at an interface; the switching material comprising a second composition at the interface with the second composition containing the second metal;

forming an ion reservoir material over the switching material;

forming a second electrode over the ion reservoir material; and wherein:

the first composition is $M_1M_2N$, where $M_1$ and $M_2$ are metals and the formula lists primary elements rather than designates a specific stoichiometry; and the second composition is $M_2O$, where $M_2$ is the metal and the formula lists primary elements rather than designates a specific stoichiometry.

12. The method of claim 11 where $M_1$ comprises Ti; and where $M_2$ comprises one or more of W, Ta, Hf, Zr and Al.

13. The method of claim 11 where $M_1$ comprises Ti; and where $M_2$ comprises one or both of Hf and Zr.

14. The method of claim 11 where $M_1$ comprises Ti; and where $M_2$ comprises Al.

15. The method of claim 11 where $M_1$ comprises Ti; and where $M_2$ comprises one or both of W and Ta.

* * * * *